US012603256B2

(12) United States Patent
Long et al.

(10) Patent No.: US 12,603,256 B2
(45) Date of Patent: Apr. 14, 2026

(54) CONDUCTIVE MEMBER FOR CLEANING FOCUS RING OF A PLASMA PROCESSING APPARATUS

(71) Applicants: Beijing E-Town Semiconductor Technology Co., Ltd., Beijing (CN); Mattson Technology, Inc., Fremont, CA (US)

(72) Inventors: Maolin Long, Santa Clara, CA (US); Changle Guan, Beijing (CN)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 172 days.

(21) Appl. No.: 17/563,560

(22) Filed: Dec. 28, 2021

(65) Prior Publication Data

US 2023/0071494 A1 Mar. 9, 2023

(51) Int. Cl.
*H01J 37/32* (2006.01)
*H01L 21/683* (2006.01)
*H01L 21/687* (2006.01)

(52) U.S. Cl.
CPC .. *H01J 37/32642* (2013.01); *H01J 37/32715* (2013.01); *H01L 21/6831* (2013.01); *H01L 21/6833* (2013.01); *H01L 21/68735* (2013.01)

(58) Field of Classification Search
CPC .............. H01J 37/32091; H01J 37/321; H01J 37/32532; H01J 37/32541; H01J 37/3255; H01J 37/32559; H01J 37/32642; H01J 37/32697; H01J 37/32715; H01J 37/32724; C23C 16/4583; C23C 16/458; C23C 16/4586; H01L 21/6831; H01L 21/6833; H01L 21/68785; H01L 21/68735
See application file for complete search history.

(56) References Cited

U.S. PATENT DOCUMENTS 6,039,836 A * 3/2000 Dhindsa ............ H01J 37/32642
204/298.31
7,025,858 B2 4/2006 Chou
(Continued)

FOREIGN PATENT DOCUMENTS

CN 108475633 A 8/2018
CN 110828272 A 2/2020
(Continued)

OTHER PUBLICATIONS

European Search Report for Application No. EP 22193929.1, mailed Feb. 1, 2023, 8 pages.

*Primary Examiner* — Kurt Sweely
(74) *Attorney, Agent, or Firm* — Dority & Manning, P.A.

(57) ABSTRACT

A pedestal assembly is provided. The pedestal assembly includes an electrostatic chuck configured to support a workpiece. The pedestal assembly includes a focus ring have a top surface and a bottom surface. The focus ring can be configured to surround a periphery of the workpiece when the workpiece is positioned on the electrostatic chuck. The pedestal assembly includes a plurality of insulators. The pedestal assembly further includes a conductive member positioned between at least a portion of the bottom surface of the focus ring and at least a portion of one of the plurality of insulators.

12 Claims, 8 Drawing Sheets

(56)        References Cited

U.S. PATENT DOCUMENTS

| | | | | |
|---|---|---|---|---|
| 7,244,336 B2 * | 7/2007 | Fischer | ............ | H01L 21/68735 |
| | | | | 156/345.47 |
| 7,658,816 B2 * | 2/2010 | Koshiishi | .......... | H01L 21/68735 |
| | | | | 156/345.43 |
| 7,988,814 B2 * | 8/2011 | Koshiishi | .......... | H01J 37/32623 |
| | | | | 156/345.43 |
| 9,076,636 B2 * | 7/2015 | Ohata | ............... | H01J 37/32642 |
| 11,037,766 B2 | 6/2021 | Kim et al. | | |
| 2004/0083975 A1 * | 5/2004 | Tong | ................ | H01J 37/32642 |
| | | | | 118/728 |
| 2008/0066867 A1 | 3/2008 | Kim et al. | | |
| 2008/0135518 A1 * | 6/2008 | Chen | ................ | H01J 37/32091 |
| | | | | 118/723 E |
| 2009/0000744 A1 * | 1/2009 | Dhindsa | ............. | H01L 21/6732 |
| | | | | 438/727 |
| 2012/0238040 A1 * | 9/2012 | Kubota | .............. | H01L 21/3065 |
| | | | | 438/5 |
| 2018/0286639 A1 * | 10/2018 | Zucker | ............. | H01J 37/32449 |
| 2020/0152427 A1 * | 5/2020 | Lee | ................... | H01J 37/32577 |
| 2020/0203115 A1 | 6/2020 | Koo | | |
| 2021/0013014 A1 | 1/2021 | Sarode Vishwanath | | |
| 2021/0104383 A1 | 4/2021 | Sasaki | | |

FOREIGN PATENT DOCUMENTS

| | | |
|---|---|---|
| CN | 111326386 A | 6/2020 |
| CN | 111587481 A | 8/2020 |

* cited by examiner

CONDUCTIVE MEMBER FOR CLEANING FOCUS RING OF A PLASMA PROCESSING APPARATUS

PRIORITY CLAIM

The present application claims the benefit of priority of Chinese Patent Application No. 202111048934.9, titled "Conductive Member for Cleaning Focus Ring of a Plasma Processing Apparatus," having a filing date of Sep. 8, 2021, which is incorporated by reference herein.

FIELD

The present disclosure relates generally to focus rings used in, for instance, a processing apparatus for processing substrates, such as semiconductor substrates.

BACKGROUND

Plasma processing tools can be used in the manufacture of devices such as integrated circuits, micromechanical devices, flat panel displays, and other devices. Plasma processing tools used in modern plasma etch applications can be required to provide a high plasma uniformity and a plurality of plasma controls, including independent plasma profile, plasma density, and ion energy controls. Plasma processing tools can, in some cases, be required to sustain a stable plasma in a variety of process gases and under a variety of different conditions (e.g. gas flow, gas pressure, etc.).

Pedestal assemblies can be used to support substrates in a plasma processing apparatus and other processing tools (e.g., thermal processing tools). Pedestal assemblies can include an electrostatic chuck and insulator rings that surround a portion of the electrostatic chuck. Pedestal assemblies can further include a focus ring that surrounds a periphery of a workpiece (e.g., semiconductor wafer) being supported by the electrostatic chuck. During processing of the workpiece, particulate can build up on the focus ring due, at least in part, to a bias voltage being applied across the workpiece via the electrostatic chuck. As such, the focus ring must be cleaned periodically to remove the particulate accumulating thereon.

SUMMARY

Aspects and advantages of the disclosure will be set forth in part in the following description, or may be obvious from the description, or may be learned through practice of the embodiments.

In one aspect, a pedestal assembly is provided. The pedestal assembly includes an electrostatic chuck configured to support a workpiece. The pedestal assembly includes a focus ring have a top surface and a bottom surface. The focus ring can be configured to surround a periphery of the workpiece when the workpiece is positioned on the electrostatic chuck. The pedestal assembly includes a plurality of insulators. The pedestal assembly further includes a conductive member positioned between at least a portion of the bottom surface of the focus ring and at least a portion of one of the plurality of insulators.

In another aspect, a plasma processing apparatus is provided. The plasma processing apparatus includes a processing chamber. The plasma processing apparatus further includes a pedestal assembly disposed within the processing chamber. The pedestal assembly includes an electrostatic chuck configured to support a workpiece. The pedestal assembly includes a focus ring have a top surface and a bottom surface. The focus ring can be configured to surround a periphery of the workpiece when the workpiece is positioned on the electrostatic chuck. The pedestal assembly includes a plurality of insulators. The pedestal assembly further includes a conductive member positioned between at least a portion of the bottom surface of the focus ring and at least a portion of one of the plurality of insulators.

These and other features, aspects and advantages of the present disclosure will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure to one of ordinary skill in the art is set forth more particularly in the remainder of the specification, including reference to the accompanying figures, in which.

DETAILED DESCRIPTION

Figure 1:
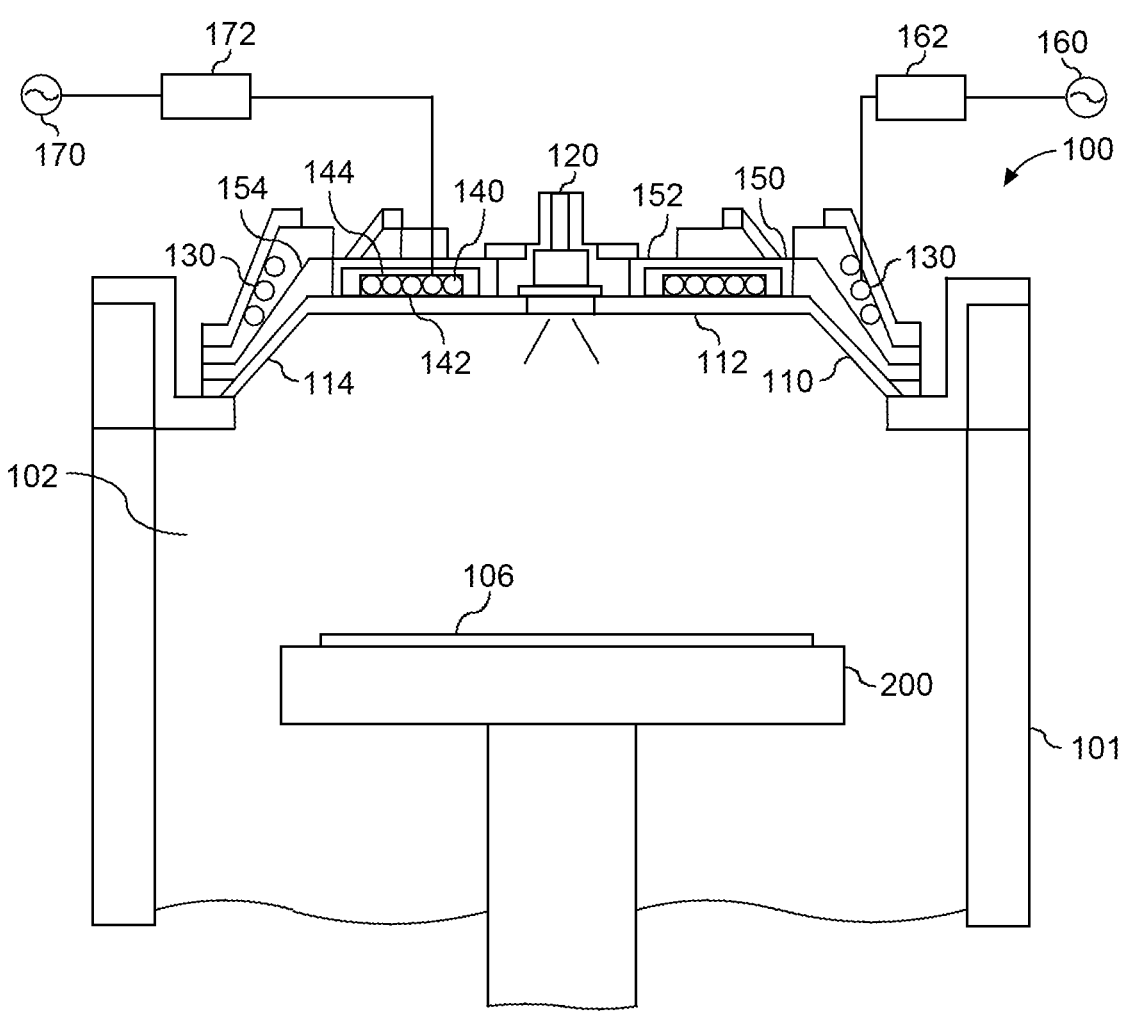
FIG. 1 depicts an example plasma processing apparatus according to an example embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to pedestal assemblies for use in conjunction with a processing apparatus, such as a plasma processing apparatus (e.g., a plasma etcher). A plasma processing apparatus can include a processing chamber defining a processing chamber. A pedestal assembly can be located within the processing chamber. The pedestal assembly can include an electrostatic chuck configured to support a workpiece (e.g., semiconductor wafer). The electrostatic chuck can be coupled to a radio frequency (RF) source. In this manner, the electrostatic chuck can receive a RF input via the RF source. When the electrostatic chuck receives the RF input, the electrostatic chuck can apply a self-bias voltage across the workpiece to facilitate plasma processing (e.g., etching) of the workpiece.

The pedestal assembly can include a plurality of insulators. For instance, the pedestal assembly can include an inner insulator ring and an outer insulator ring. The inner insulator ring can surround a portion of a periphery of the electrostatic chuck. The outer insulator ring can surround a periphery of the inner insulator ring. The inner insulator ring and the outer insulator ring can each include a dielectric material (e.g., aluminum oxide, yttrium oxide, quartz).

The pedestal assembly can include a focus ring that surrounds the periphery of the workpiece on the electrostatic chuck. In this manner, the focus ring can be used, for instance, to reduce non-uniformity in the plasma process (e.g., etch rate) at or near the periphery of the workpiece. However, byproduct or particulate generated due, in part, to plasma processing (e.g., etching) of the workpiece can accumulate on the focus ring. In particular, the particulate can accumulate at or near a periphery of the focus ring. Since the particulate can shorten the usable life of the focus ring, conventional plasma processing apparatuses must be taken offline periodically to allow the focus ring to be cleaned. In particular, the particulate that accumulated on the focus ring can be removed therefrom.

Example aspects are directed to pedestal assemblies having a conductive member configured to reduce an amount of particulate that accumulates on the focus ring. For instance, the conductive member can be positioned between a bottom surface of the focus ring and at least a portion of one of the insulators (e.g., inner insulator ring, outer insulator ring, upper ring, cover ring). Furthermore, in some implementations, the conductive member can be positioned closer to a periphery of the focus ring than a center of the focus ring. In this manner, the conductive member can be positioned to reduce the amount of particulate that accumulates on the focus ring. For instance, the conductive member can be positioned to reduce the amount of particulate accumulating at the periphery of the focus ring.

In some implementations, the conductive member can be spaced apart from the electrostatic chuck along a first axis by a first distance. For instance, the first distance can range from about 2 millimeters to about 5 millimeters. In some implementations, the first distance can be no greater than about 3 millimeters. Alternatively, or additionally, the conductive member can be spaced apart from the electrostatic chuck along a second axis by a second distance to control electrically coupling between the electrostatic chuck and the conductive member. The second axis can be substantially perpendicular (e.g., less than a 15 degree, less than a 10 degree, less than a 5 degree, less than a 1 degree, etc. difference from 90 degrees) to the first axis. It should be understood that consumption of the focus ring is a function of the second distance. For instance, reducing the second distance can increase consumption of the focus ring and thereby reduce the usable life of the focus ring.

In some implementations, the conductive member can include a semiconductor material. In alternative implementations, the conductive member can include a metal. For instance, in some implementations, the conductive member can include aluminum. Furthermore, in some implementations, a surface of the conductive member can be anodized.

In some implementations, the conductive member can be a conductive ring. It should be understood that the conductive member can have any suitable shape. It should also be understood that pedestal assemblies according to example aspects of the present disclosure can, in some implementations, include multiple conductive members.

Pedestal assemblies according to example aspects of the present disclosure can have a number of technical effects and benefits. For instance, the conductive member reduce a rate at which the particulate associated with plasma processing (e.g., plasma etching) of the workpiece accumulates on the focus ring. In this manner, the conductive member can allow plasma processing apparatuses to operate for longer periods of time before needing to be taken offline to allow for cleaning of the focus ring. Accordingly, plasma processing apparatuses having pedestal assemblies according to example aspects of the present disclosure can have a higher throughput comparted to conventional plasma processing apparatuses.

Aspects of the present disclosure are discussed with reference to a "substrate" or "wafer" for purposes of illustration and discussion. Those of ordinary skill in the art, using the disclosures provided herein, will understand that the example aspects of the present disclosure can be used in association with any semiconductor substrate or other suitable substrate or workpiece. In addition, the use of the term "about" in conjunction with a numerical value is intended to refer to within 10% of the stated numerical value.

Referring now to the FIGS., FIG. 1 depicts a plasma processing apparatus 100 according to example embodiments of the present disclosure. The present disclosure is discussed with reference to the plasma processing apparatus 100 depicted in FIG. 1 for purposes of illustration and discussion. Those of ordinary skill in the art, using the disclosures provided herein, will understand that example aspects of the present disclosure can be used with other processing tools and/or apparatus without deviating from the scope of the present disclosure, such as plasma strip tools, thermal processing tools, etc.

The plasma processing apparatus 100 includes a processing chamber 101 defining an processing chamber 102. A pedestal assembly 104 is used to support a workpiece 106, such as a semiconductor wafer, within the processing chamber 102. A dielectric window 110 is located above the pedestal assembly 104 and acts as a ceiling of the processing chamber 102. The dielectric window 110 includes a relatively flat central portion 112 and an angled peripheral portion 114. The dielectric window 110 includes a space in the central portion 112 for a showerhead 120 to feed process gas into the processing chamber 102.

The plasma processing apparatus 100 further includes a plurality of inductive elements, such as primary inductive element 130 and secondary inductive element 140, for generating an inductive plasma in the processing chamber 102. The inductive elements 130, 140 can include a coil or antenna element that when supplied with RF power, induces a plasma in the process gas in the processing chamber 102 of plasma processing apparatus 100. For instance, a first RF generator 160 can be configured to provide electromagnetic energy through a matching network 162 to the primary inductive element 130. A second RF generator 170 can be configured to provide electromagnetic energy through a matching network 172 to the secondary inductive element 140.

While the present disclosure makes reference to a primary inductive element and a secondary inductive element, those of ordinary skill in the art, should appreciate that the terms primary and secondary are used for convenience purposes only. The secondary coil can be operated independently of the primary coil. The primary coil can be operated independently of the secondary coil. In addition, in some embodiments, the plasma processing apparatus may only have a single inductive coupling element.

According to aspects of the present disclosure, the plasma processing apparatus 100 can include a metal shield portion 152 disposed around the secondary inductive element 140. The metal shield portion 152 separates the primary inductive element 130 and the secondary inductive element 140 to reduce cross-talk between the inductive elements 130, 140. The plasma processing apparatus 100 can further include a first Faraday shield 154 disposed between the primary inductive element 130 and the dielectric window 110. The first Faraday shield 154 can be a slotted metal shield that reduces capacitive coupling between the primary inductive element 130 and the process chamber 101. As illustrated, the first Faraday shield 154 can fit over the angled portion of the dielectric window 110.

In some implementations, the metal shield 152 and the first Faraday shield 154 can form a unitary body metal shield/Faraday shield 150 for ease of manufacturing and other purposes. The multi-turn coil of the primary inductive element 130 can be located adjacent the first Faraday shield 154 of the unitary body metal shield/Faraday shield 150. The secondary inductive element 140 can be located proximate the metal shield portion 152 of metal shield/Faraday shield unitary body 150, such as between the metal shield portion 152 and the dielectric window 110.

The arrangement of the primary inductive element 130 and the secondary inductive element 140 on opposite sides of the metal shield 152 allows the primary inductive element 130 and secondary inductive element 140 to have distinct structural configurations and to perform different functions. For instance, the primary inductive element 130 can include a multi-turn coil located adjacent a peripheral portion of the process chamber 101. The primary inductive element 130 can be used for basic plasma generation and reliable start during the inherently transient ignition stage. The primary inductive element 130 can be coupled to a powerful RF generator and expensive auto-tuning matching network and can be operated at an increased RF frequency, such as at about 13.56 MHz.

The secondary inductive element 140 can be used for corrective and supportive functions and for improving the stability of the plasma during steady state operation. Since the secondary inductive element 140 can be used primarily for corrective and supportive functions and improving stability of the plasma during steady state operation, the secondary inductive element 140 does not have to be coupled to as powerful an RF generator as the primary inductive element 130 and can be designed differently and cost effectively to overcome the difficulties associated with previous designs. As discussed in detail below, the secondary inductive element 140 can also be operated at a lower frequency, such as at about 2 MHz, allowing the secondary inductive element 140 to be very compact and to fit in a limited space on top of the dielectric window.

The primary inductive element 130 and the secondary inductive element 140 can be operated at different frequencies. The frequencies can be sufficiently different to reduce cross-talk in the plasma between the primary inductive element 130 and the secondary inductive element 140. For instance, the frequency applied to the primary inductive element 130 can be at least about 1.5 times greater than the frequency applied to the secondary inductive element 140. In some implementations, the frequency applied to the primary inductive element 130 can be about 13.56 MHz and the frequency applied to the secondary inductive element 140 can be in the range of about 1.75 MHz to about 2.15

MHz. Other suitable frequencies can also be used, such as about 400 kHz, about 4 MHz, and about 27 MHz. While the present disclosure is discussed with reference to the primary inductive element 130 being operated at a higher frequency relative to the secondary inductive element 140, those of ordinary skill in the art, using the disclosures provided herein, should understand that the secondary inductive element 140 could be operated at the higher frequency without deviating from the scope of the present disclosure.

The secondary inductive element 140 can include a planar coil 142 and a magnetic flux concentrator 144. The magnetic flux concentrator 144 can be made from a ferrite material. Use of a magnetic flux concentrator with a proper coil can give high plasma coupling and good energy transfer efficiency of the secondary inductive element 140, and can significantly reduce its coupling to the metal shield 150. Use of a lower frequency, such as about 2 MHz, on the secondary inductive element 140 can increase skin layer, which also improves plasma heating efficiency.

According to aspects of the present disclosure, the different inductive elements 130 and 140 can carry different functions. Specifically, the primary inductive element 130 can be used to carry out the basic functions of plasma generation during ignition and providing enough priming for the secondary inductive element 140. The primary inductive element 130 can have coupling to both plasma and the grounded shield to stabilize plasma potential. The first Faraday shield 154 associated with the primary inductive element 130 avoids window sputtering and can be used to supply the coupling to the ground.

Additional coils can be operated in the presence of good plasma priming provided by the primary inductive element 130 and as such, preferably have good plasma coupling and good energy transfer efficiency to plasma. A secondary inductive element 140 that includes a magnetic flux concentrator 144 provides both a good transfer of magnetic flux to plasma volume and at the same time a good decoupling of the secondary inductive element 140 from the surrounding metal shield 150. The use of magnetic flux concentrators 144 and symmetric driving of the secondary inductive element 140 further reduces the amplitude of the voltage between coil ends and surrounding grounded elements. This can reduce sputtering of the dome, but at the same time gives some small capacitive coupling to plasma, which can be used to assist ignition. In some implementations, a second Faraday shield can be used in combination with this secondary inductive element 140 to reduce capacitive coupling of the secondary inductive element 140.

Figure 2:
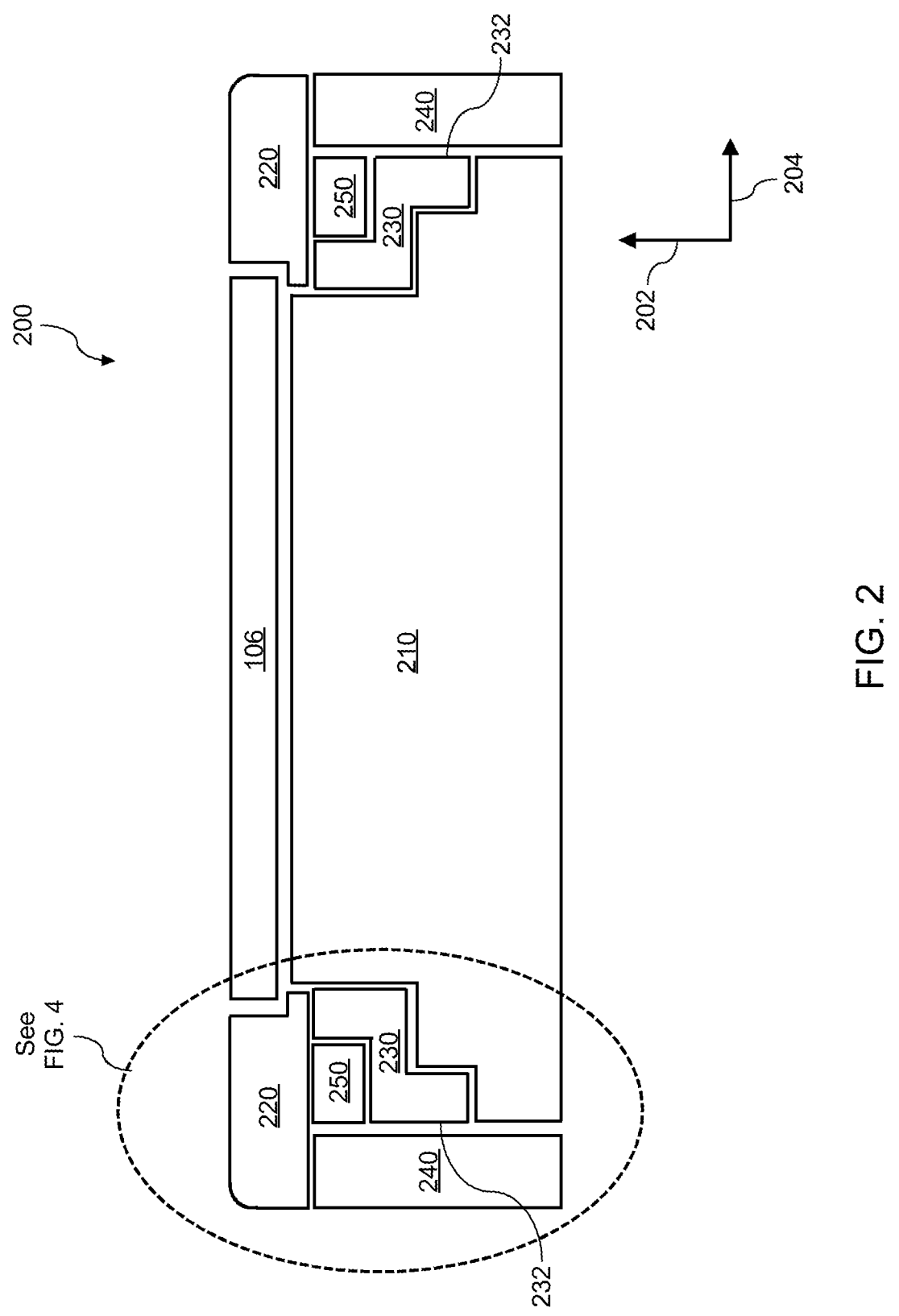
FIG. 2 depicts a pedestal assembly according to an example embodiment of the present disclosure.

Referring now to FIG. 2, a pedestal assembly 200 is provided according to an example embodiment of the present disclosure. As shown, the pedestal assembly 200 can include an electrostatic chuck 210. In some implementations, the electrostatic chuck 210 can include one or more clamping electrodes. The one or more electrodes can be configured to hold the workpiece 106. For instance, a self-bias voltage can be applied across the workpiece 106 when a radio frequency (RF) input is provided to the electrostatic chuck 210. In this manner, the electrostatic chuck 210 can absorb irons associated with plasma and bombard the workpiece 106 to promote a plasma processing process (e.g., plasma etching). Alternatively, or additionally, the electrostatic chuck 210 can include a temperature regulation system (e.g., fluid channels, electric heaters, etc.) that can be used to control a temperature profile across the workpiece 106.

The pedestal assembly 200 can include a focus ring 220. The focus ring 220 can be arranged relative to the electrostatic chuck 210 so that the focus ring 220 surrounds a periphery of the workpiece 106 when the workpiece 106 is positioned on the electrostatic chuck 210. In some implementations, the focus ring 220 can include a dielectric material. For instance, in some implementations, the dielectric material can include Aluminum Oxide (Al$_2$O$_3$) or Yttrium oxide (Y$_2$O$_3$). In alternative implementations, the dielectric material can include quartz. It should be appreciated, however, that the focus ring 220 can include any suitable dielectric material.

The pedestal assembly 200 can include one or more insulators. For instance, in some implementations, the pedestal assembly 200 can include an inner insulator ring 230 and an outer insulator ring 240. As shown, the inner insulator ring 230 can surround a portion of a periphery 216 (FIG. 3) of the electrostatic chuck 210. The outer insulator ring 240 can surround a periphery 232 of the inner insulator ring 230. In some implementations, the inner insulator ring 230 and the outer insulator ring 240 can include a dielectric material. For instance, in some implementations, the dielectric material can include Aluminum Oxide (Al$_2$O$_3$) or Yttrium oxide (Y$_2$O$_3$). In alternative implementations, the dielectric material can include quartz. It should be appreciated, however, that the inner insulator ring 230 and the outer insulator ring 240 can include any suitable dielectric material.

The pedestal assembly 200 can include a conductive member 250 configured to reduce an amount of particulate associated with plasma processing of the workpiece 106 from accumulating on the focus ring 220. As shown, the conductive member 250 can be positioned between a bottom surface of the focus ring 220 and at least a portion of the and the inner insulator ring 230. In this manner, the conductive member 250 can be positioned to reduce the amount of particulate that accumulates on the focus ring 220. For instance, the conductive member 250 can reduce the amount of particulate accumulating at or near the periphery of the focus ring 220.

In some implementations, the conductive member 250 can include a metal. For instance, the conductive member 250 can include aluminum. Furthermore, in such implementations, a surface of the conductive member 250 can be anodized. In alternative implementations, the conductive member 250 can include a semiconductor material. It should be appreciated that the conductive member 250 can have any suitable shape. For instance, in some implementations, the conductive member 250 can be a conductive ring.

Figure 3:
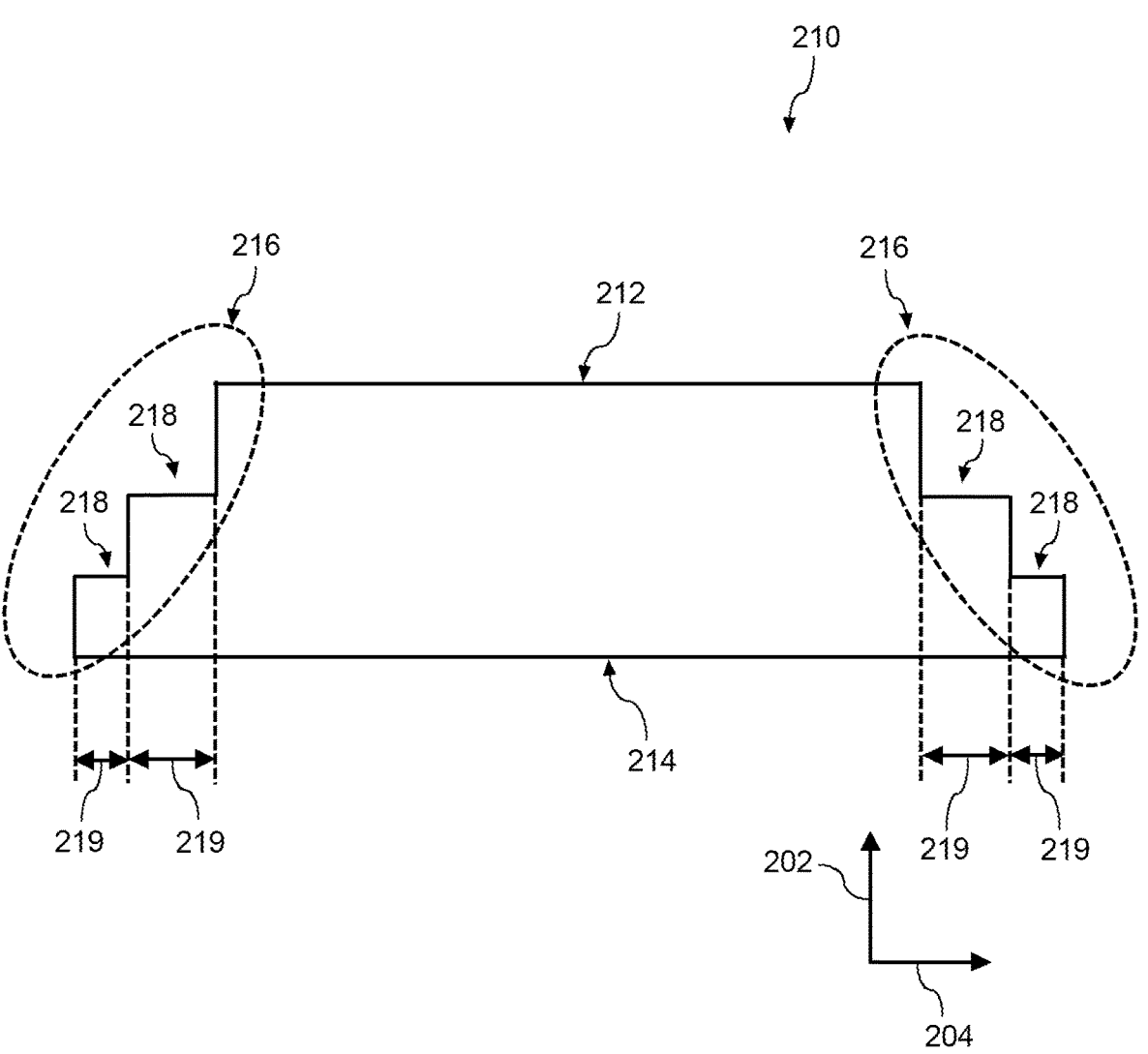
FIG. 3 depicts an electrostatic chuck of the pedestal assembly of FIG. 2.

Referring now to FIG. 3, the electrostatic chuck 210 can extend along a first axis 202 (e.g., vertical axis) between a top 212 of the electrostatic chuck 210 and a bottom 214 of the electrostatic chuck 210. Additionally, the electrostatic chuck 210 can extend along a second axis 204 (e.g., horizontal axis) that is substantially perpendicular (e.g., less than a 15 degree, less than a 10 degree, less than a 5 degree, less than a 1 degree, etc. difference from 90 degrees) to the first axis 202 to the periphery 216 of the electrostatic chuck 210. In some implementations, the periphery of 216 of the electrostatic chuck 210 can define a plurality of stepped surfaces 218. For instance, in some implementations, the periphery 216 of the electrostatic chuck 210 can define two stepped surfaces (e.g., a first stepped surface and a second stepped surface). In alternative implementations, the periphery 216 of the electrostatic chuck 210 can define more than two stepped surfaces. Alternatively, or additionally, each of the plurality of stepped surfaces 218 can have a different depth 219. For instance, a first stepped surface of the plurality of stepped surfaces 218 can have a first depth, whereas a second stepped surface of the plurality of stepped surfaces 218 can have a second depth that is different (e.g., deeper, shallower) than the first depth.

Figure 4:
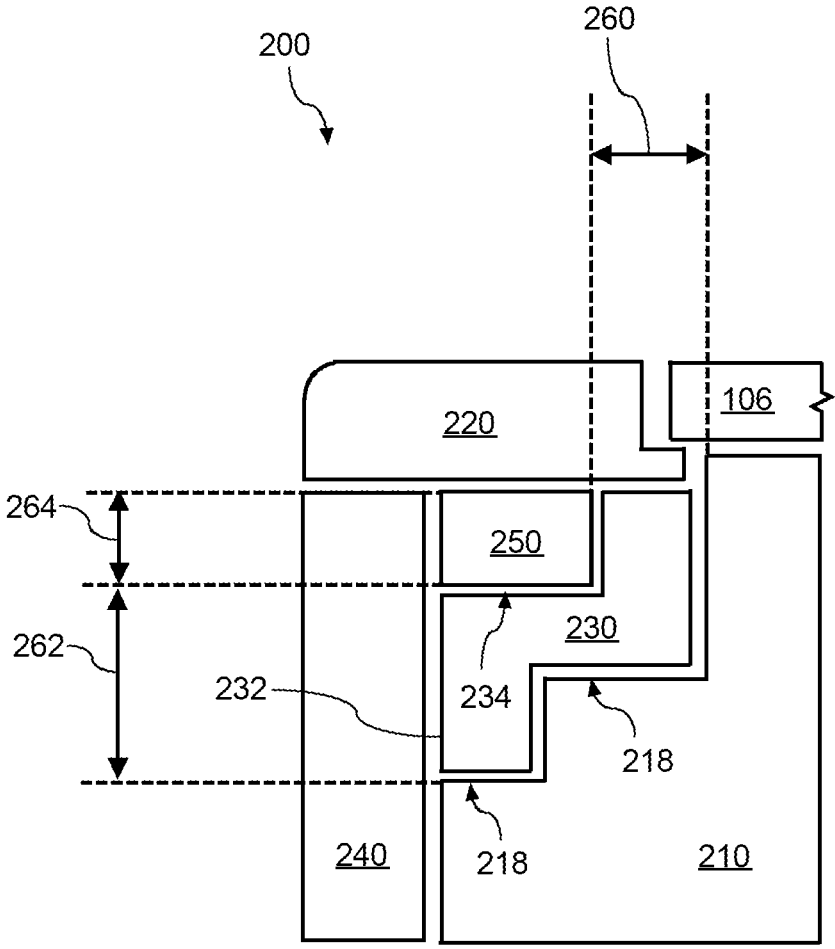
FIG. 4 depicts a portion of the pedestal assembly of FIG. 2.
Figure 4:
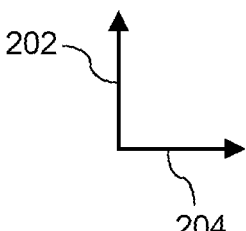

Referring now to FIG. 4, the inner insulator ring 230 can, in some implementations, be positioned on the periphery 216 (FIG. 3) of the electrostatic chuck 210. For instance, a first portion of the inner insulator ring 230 can be positioned on a first stepped surface of the plurality of stepped surface 218 defined by the periphery 216 of the electrostatic chuck 210. In addition, a second portion of the inner insulator ring 230 can be positioned on a second stepped surface of the plurality of stepped surface 218 defined by the periphery 216 of the electrostatic chuck 210.

In some implementations, the inner insulator ring 230 can define a stepped surface 234. As shown, the conductive member 250 can be positioned on the stepped surface 234 defined by the inner insulator ring 230 such that the conductive member 250 is positioned between the focus ring 220 and the stepped surface 234 along the first axis 202. Furthermore, the conductive member 250 can be positioned between the outer insulator ring 240 and a portion of the inner insulator ring 230 along the second axis 204.

The conductive member 250 can be spaced apart from the electrostatic chuck 210 along the first axis 202 by a first distance 260. For instance, in some implementations, the first distance 260 can range from about 2 millimeters to about 5 millimeters. In alternative implementations, the first distance 260 can be no greater than about 15 millimeters.

The conductive member 250 can also be spaced apart from the electrostatic chuck 210 along the second axis 204 by a second distance 262 to control electrically coupling between the electrostatic chuck 210 and the conductive member 250. It should be understood that consumption of the focus ring 220 can be a function of the second distance 262. For instance, reducing the second distance 262 can increase consumption of the focus ring 220 and thereby reduce the usable life of the focus ring 220. In some implementations, the second distance 262 can range from about 2 millimeters to about 10 millimeters. In alternative implementations, the second distance 262 can be zero such that the conductive member 250 contacts a portion of the electrostatic chuck 210.

In some implementations, a thickness 264 of the conductive member 250 can be no more than 1 millimeter. It should be understood that the conductive member 250 can have any suitable thickness 264. For instance, in some implementations, the thickness 264 of the conductive member 250 can be greater than 1 millimeter.

Figure 5:
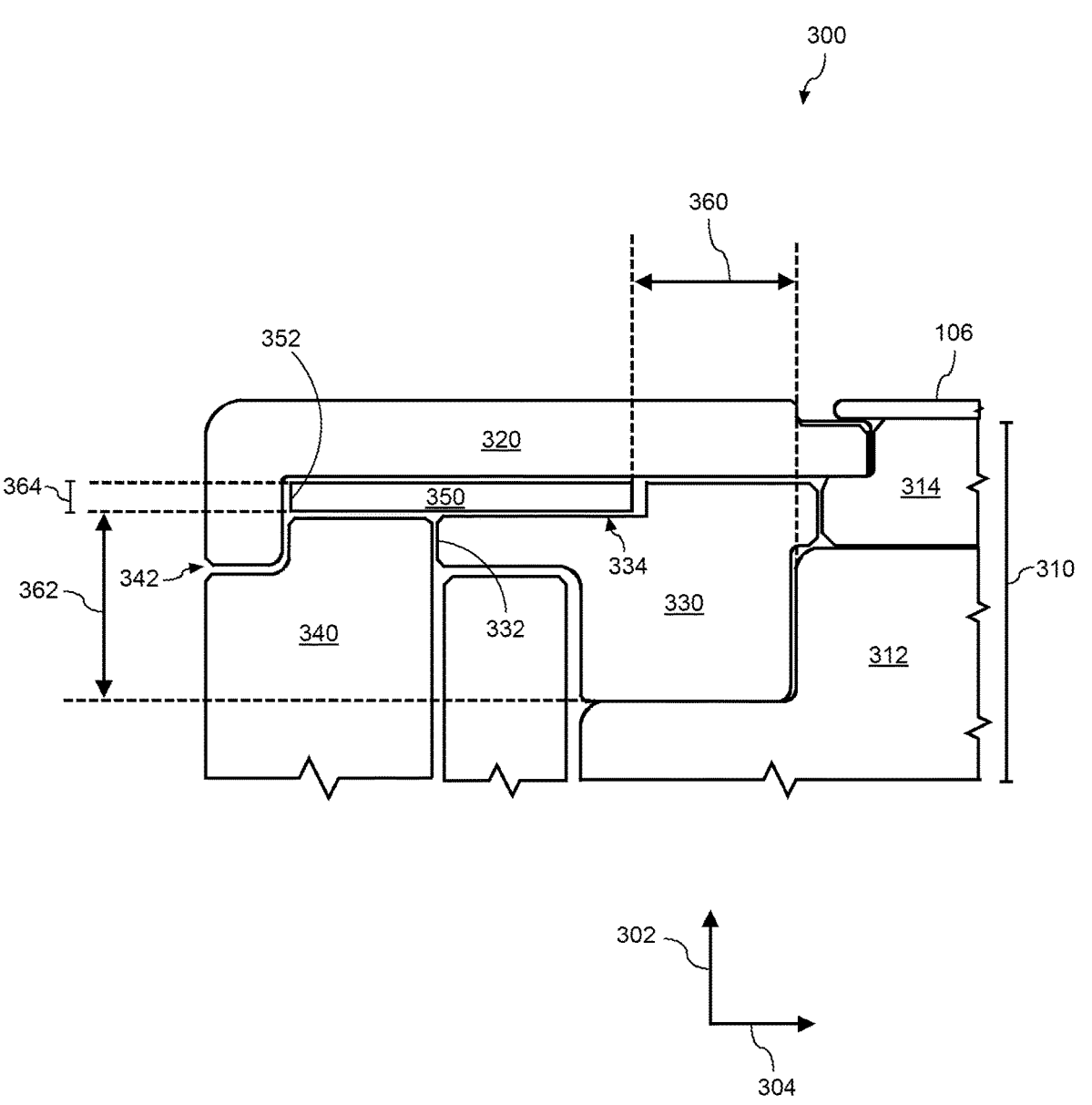
FIG. 5 depicts a portion of a pedestal assembly according to another example embodiment of the present disclosure.

Referring now to FIG. 5, a portion of a pedestal assembly 300 according to another example embodiment of the present disclosure is provided. The pedestal assembly 300 can include an electrostatic chuck 310. The electrostatic chuck 310 can include a baseplate 312. The baseplate can extend along a first axis 302 (e.g., a vertical axis) and a second axis 304 (e.g., a horizontal axis) that is substantially perpendicular (e.g., less than a 15 degree, less than a 10 degree, less than a 5 degree, less than a 1 degree, etc. difference from 90 degrees) to the first axis 302. In some implementations, the baseplate 312 can define one or more passages through which a fluid (e.g., water) flows to reduce (e.g., cool) a temperature of the baseplate.

The electrostatic chuck 310 can further include a puck 314. The puck 314 can be disposed on the baseplate 312. The puck 314 can be configured to support the workpiece 106. In some implementations, the puck 314 can include one or more clamping electrodes configured to hold the workpiece 106 via an electrostatic charge.

The pedestal assembly 300 can include a focus ring 320. The focus ring 320 can be configured to surround a periphery of the workpiece 106 when the workpiece 106 is positioned on the puck 314. The focus ring 320 can include a first portion (e.g., horizontal portion) and a second portion (e.g., a vertical portion). The first portion of the focus ring 320 can extend along the first axis 302. The second portion of the focus ring 320 can extend from the first portion thereof and along the second axis 304.

In some implementations, the focus ring 320 can include a dielectric material. For instance, in some implementations, the dielectric material can include Aluminum Oxide ($Al_2O_3$) or Ytrrium oxide ($Y_2O_3$). In alternative implementations, the dielectric material can include quartz. It should be appreciated, however, that the focus ring 320 can include any suitable dielectric material.

The pedestal assembly 300 can include one or more insulator rings. For instance, in some implementations, the one or more insulator rings can include an inner insulator ring 330 and an outer insulator ring 340. The inner insulator ring 330 can surround a portion of a periphery of the baseplate 312. The outer insulator ring 340 can surround a periphery 332 of the inner insulator ring 330. In some implementations, the outer insulator ring 340 can define a stepped surface 342 on which the second portion (e.g., vertical portion) of the focus ring 320 can be positioned.

The inner insulator ring 330 and the outer insulator ring 340 can include a dielectric material. For instance, in some implementations, the dielectric material can include Aluminum Oxide ($Al_2O_3$) or Ytrrium oxide ($Y_2O_3$). In alternative implementations, the dielectric material can include quartz. It should be appreciated, however, that the inner insulator ring 230 and the outer insulator ring 240 can include any suitable dielectric material.

The pedestal assembly 300 can include a conductive member 350 configured to reduce an amount of particulate associated with plasma processing of the workpiece 106 from accumulating on the focus ring 320. As shown, the conductive member 350 can be positioned between the focus ring 320 and a stepped surface 344 defined by the and the inner insulator ring 330. In addition, the conductive member 350 can be positioned between the outer insulator ring 340 and the first portion (e.g., horizontal portion) of the focus ring 320. Furthermore, the second portion (e.g., vertical portion) of the focus ring 320 can surround a periphery 352 of the conductive member 350. In this manner, the focus ring 320 cand the insulator rings (that is, the inner insulator ring 330 and the outer insulator ring 340) can shield the conductive member 350 from plasma generated within the processing chamber 102 (FIG. 1).

In some implementations, the conductive member 350 can include a metal. For instance, the conductive member 350 can include aluminum. Furthermore, in such implementations, a surface of the conductive member 350 can be anodized. In alternative implementations, the conductive member 350 can include a semiconductor material. In some implementations, the conductive member 350 can be a conductive ring. In alternative implementations, the conductive member 350 can have a different shape.

The conductive member 350 can be spaced apart from the baseplate 312 along the first axis 302 by a first distance 360. For instance, in some implementations, the first distance 360 can range from about 2 millimeters to about 5 millimeters. In alternative implementations, the first distance 260 can be no greater than about 3 millimeters.

The conductive member 350 can also be spaced apart from the baseplate along the second axis 304 by a second distance 362 to control electrically coupling between the electrostatic chuck 310 and the conductive member 350. It should be understood that consumption of the focus ring 320 can be a function of the second distance 362. For instance, reducing the second distance 362 can increase consumption of the focus ring 320 and thereby reduce the usable life of the focus ring 320. In some implementations, the second distance 362 can range from about 2 millimeters to about 10 millimeters.

In some implementations, a thickness 364 of the conductive member 350 can be no more than about 1 millimeter. It should be understood that the conductive member 350 can have any suitable thickness 364. For instance, in some implementations, the thickness 364 of the conductive member 350 can be greater than 1 millimeter.

Figure 6:
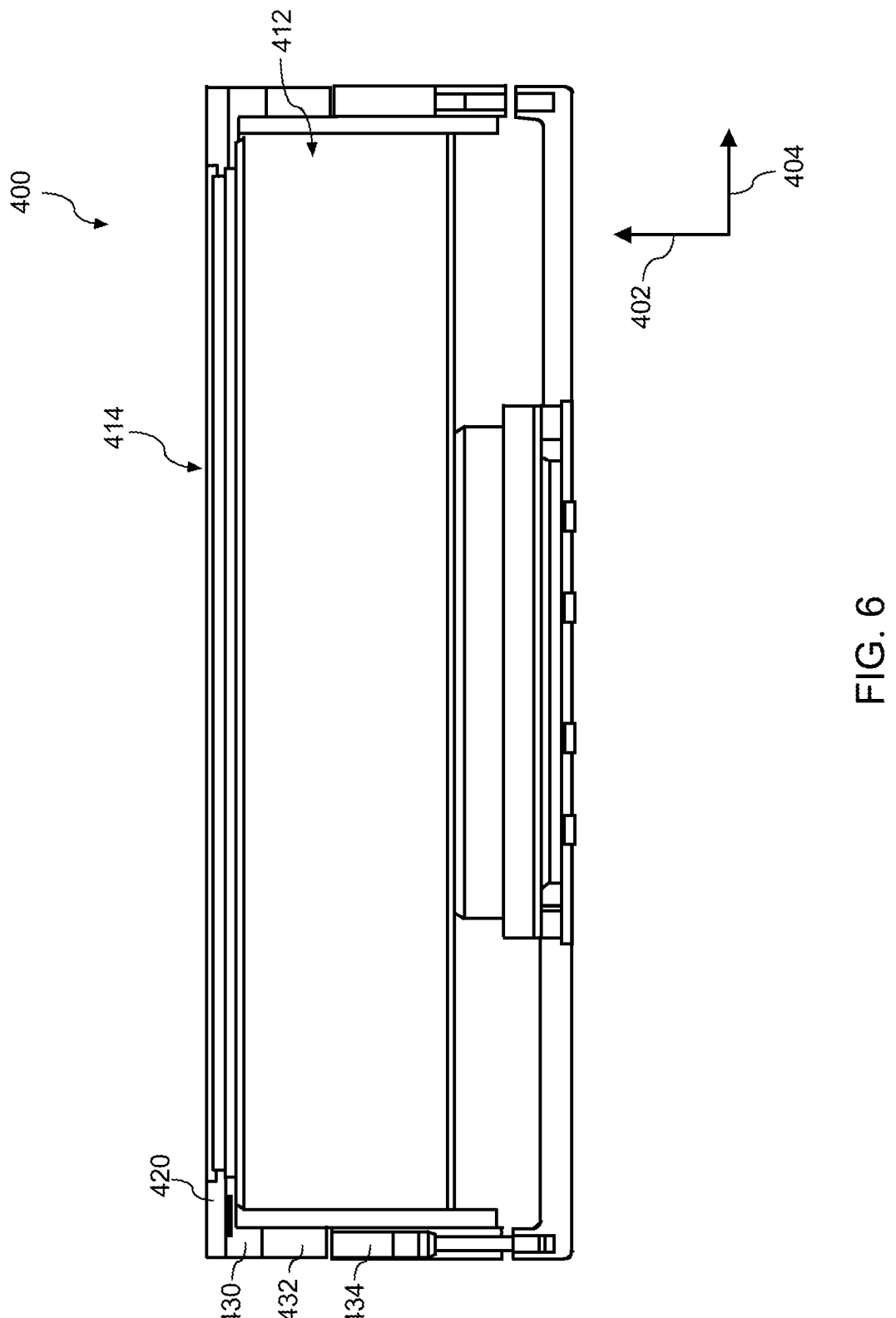
FIG. 6 depicts a pedestal assembly according to yet another example embodiment of the present disclosure.
Figure 7:
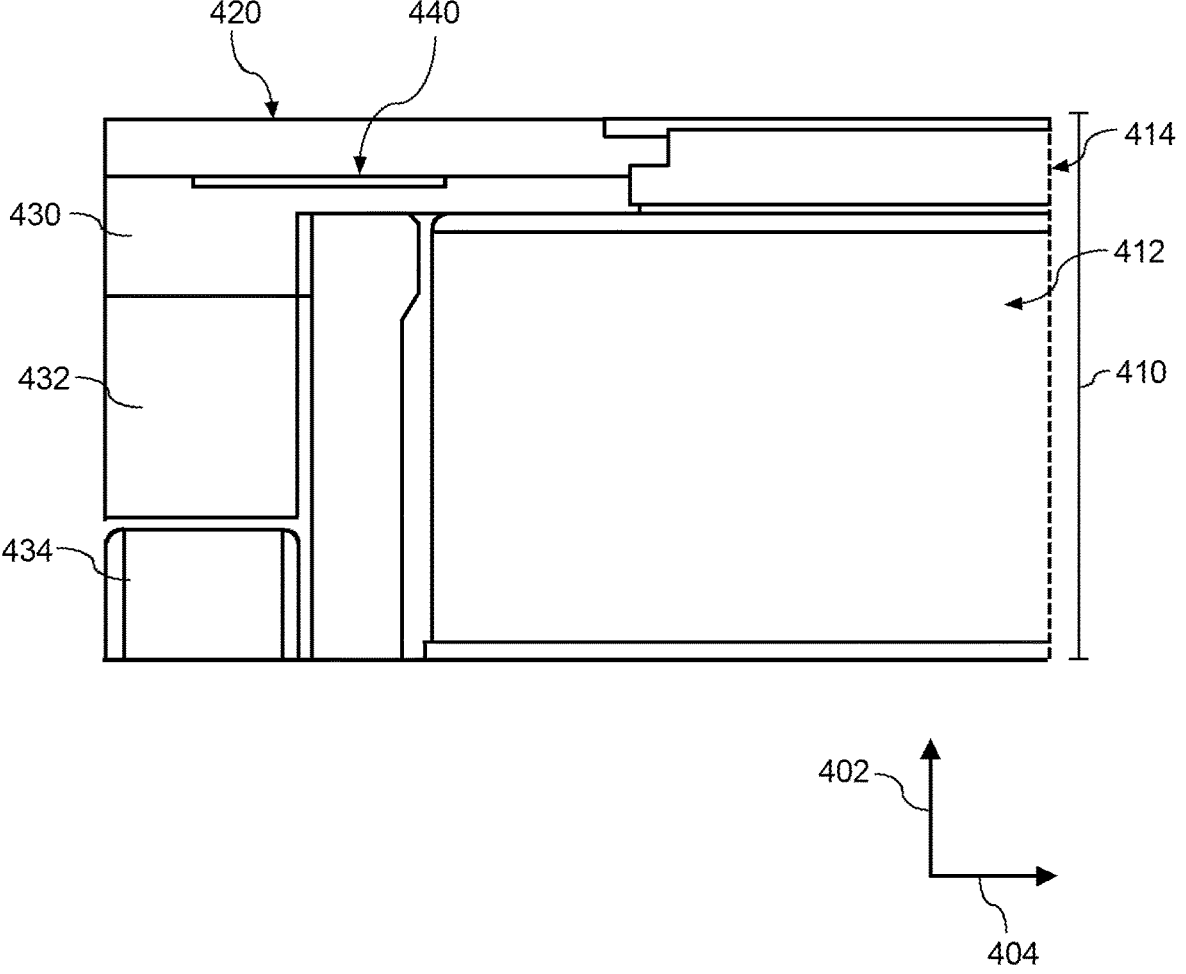
FIG. 7 depicts a portion of the pedestal assembly of FIG. 6.

Referring now to FIGS. 6 and 7, a pedestal assembly 400 is provided according yet another example embodiment of the present disclosure. As shown, the pedestal assembly 400 can include an electrostatic chuck 410. The electrostatic chuck 410 can include a baseplate 412. The baseplate can extend along a first axis 402 (e.g., a vertical axis) and a second axis 404 (e.g., a horizontal axis) that is substantially perpendicular (e.g., less than a 15 degree, less than a 10 degree, less than a 5 degree, less than a 1 degree, etc. difference from 90 degrees) to the first axis 402. In some implementations, the baseplate 412 can define one or more passages through which a fluid (e.g., water) flows to reduce (e.g., cool) a temperature of the baseplate.

The electrostatic chuck 410 can further include a puck 414. The puck 414 can be disposed on the baseplate 412. The puck 414 can be configured to support the workpiece 106. In some implementations, the puck 414 can include one or more clamping electrodes configured to hold the workpiece 106 via an electrostatic charge.

The pedestal assembly 400 can include a focus ring 420. The focus ring 420 can be arranged relative to the electrostatic chuck 410 so that the focus ring 420 surrounds a periphery of the workpiece 106 when the workpiece 106 is positioned on the electrostatic chuck 410. In some implementations, the focus ring 420 can include a dielectric material. For instance, in some implementations, the dielectric material can include Aluminum Oxide ($Al_2O_3$) or Ytrrium oxide ($Y_2O_3$). In alternative implementations, the dielectric material can include quartz. It should be appreciated, however, that the focus ring 420 can include any suitable dielectric material.

The pedestal assembly 400 can include a plurality of insulators. For instance, in some implementations, the plurality of insulators can include a first insulator 430 (e.g., upper ring), a second insulator 432 (e.g. cover ring), and a third insulator 434 (e.g., clamp ring). In alternative implementations, the pedestal assembly 400 can include more or fewer insulators. It should be appreciated that the plurality of insulators can include any suitable dielectric material. For instance, in some implementations, the first insulator 430 and the second insulator 432 can each include a quartz material. Alternatively, or additionally, the third insulator 434 can include aluminum with Yttria coating.

The pedestal assembly 400 can include a conductive member 440 positioned between a bottom surface of the focus ring 420 and one of the plurality of insulators. For instance, the conductive member 440 can be positioned between the bottom surface of the focus ring 420 and the first insulator 430 (e.g., upper ring). In this manner, the conductive member 440 can be positioned to reduce an amount of particulate associated with plasma processing of the workpiece 106 from accumulating on the focus ring 420.

In some implementations, the conductive member 440 can include a metal. For instance, the conductive member 440 can include aluminum. Furthermore, in such implementations, a surface of the conductive member 440 can be anodized. In alternative implementations, the conductive member 440 can include a semiconductor material. In some implementations, the conductive member 440 can be a conductive ring. In alternative implementations, the conductive member 440 can have a different shape.

Figure 8:
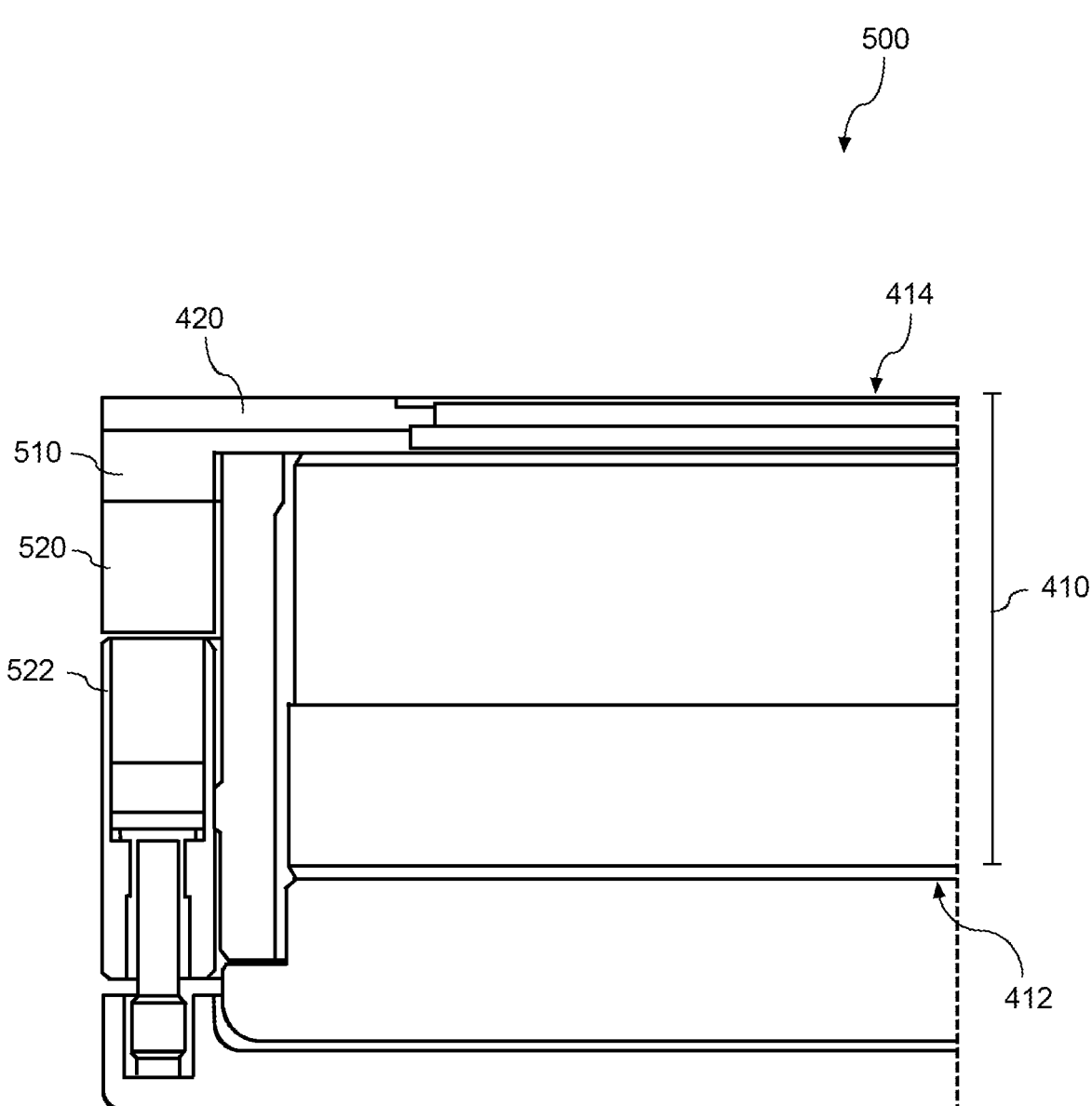
FIG. 8 depicts a portion of a pedestal assembly according to still another example embodiment of the present disclosure.

Referring now to FIG. 8, another a pedestal assembly 500 is provided according to still another example embodiment of the present disclosure. The pedestal assembly 500 can be configured in substantially the same manner as the pedestal assembly 400 discussed above with reference to FIGS. 6 and 7. For instance, the pedestal assembly 500 can include the electrostatic chuck 410 and the focus ring 420. However, the pedestal assembly 500 does not include a conductive member 440 (FIG. 7) positioned between the bottom surface of the focus ring 420 and the first insulator 430 (FIG. 6). Instead, the pedestal assembly 500 replaces the first insulator 430 with a conductive member 510. In this manner, the pedestal assembly 500 of FIG. 8 includes fewer insulators than the pedestal assembly 400 of FIGS. 6 and 7. More specifically, the pedestal assembly 500 of FIG. 8 include a first insulator 520 (e.g., cover ring) and a second insulator 522 (e.g., clamp ring).

As shown, the conductive member 510 is positioned between the bottom surface of the focus ring 420 and the first insulator 520 (e.g., cover ring). In some implementations, the conductive member 510 can include silicon carbide (SiC). It should be appreciated, however, the conductive member 510 can include any suitable conductive material. In some implementations, the conductive member 510 can be a conductive ring. In alternative implementations, the conductive member 510 can have a different shape.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged in whole or in part. Furthermore, those of ordinary skill in the art will appreciate that the foregoing description is by way of example only and is not intended to limit the invention so further described in such appended claims.

What is claimed is:

1. A pedestal assembly comprising:
an electrostatic chuck configured to support a workpiece, the electrostatic chuck defining a plurality of stepped surfaces, each of the plurality of stepped surfaces comprises a different horizontal depth;
a focus ring having a top surface and a bottom surface, the focus ring configured to surround a periphery of the workpiece when the workpiece is positioned on the electrostatic chuck;
an inner insulator ring configured to surround a portion of a periphery of the electrostatic chuck;
an outer insulator ring configured to surround a periphery of the inner insulator ring, the electrostatic chuck, and a conductive member, the focus ring being on the outer insulator ring such that the bottom surface of the focus ring is on a top surface of the outer insulator ring; and
the conductive member positioned vertically between at least a portion of the bottom surface of the focus ring, a top surface of the inner insulator ring, and positioned horizontally between a portion of the inner insulator ring and the outer insulator ring, the conductive member is spaced apart from the periphery of the electrostatic chuck along a first axis by a first distance and the conductive member is spaced apart from the periphery of the electrostatic chuck along a second axis by a second distance, the first axis intersecting with the second axis in a plane, and the first axis and the second axis forming an angle that differs from 90 degrees by less than 15 degrees.

2. The pedestal assembly of claim 1, wherein the conductive member comprises a semiconductor material.

3. The pedestal assembly of claim 1, wherein the conductive member comprises a metal.

4. The pedestal assembly of claim 1, wherein the first distance is different than the second distance.

5. The pedestal assembly of claim 1, wherein the first distance ranges from about 2 millimeters to about 5 millimeters.

6. The pedestal assembly of claim 1, wherein the conductive member comprises a conductive ring.

7. The pedestal assembly of claim 1, wherein the inner insulator ring comprises:
a first portion positioned on a first stepped surface of the plurality of stepped surfaces; and
a second portion positioned on a second stepped surface of the plurality of stepped surfaces.

8. The pedestal assembly of claim 1, wherein the conductive member is positioned between the stepped surface defined by the inner insulator ring and a first portion of the bottom surface of the focus ring.

9. The pedestal assembly of claim 8, wherein:
the conductive member is spaced apart from the periphery of the electrostatic chuck along a first axis by a first distance; and
the conductive member is spaced apart from the periphery of the electrostatic chuck along a second axis by a second distance, the second axis being substantially perpendicular to the first axis.

10. The pedestal assembly of claim 9, wherein the first distance is different than the second distance.

11. A plasma processing apparatus comprising:
a processing chamber; and
a pedestal assembly disposed within the processing chamber, the pedestal assembly comprising:
an electrostatic chuck configured to support a workpiece, the electrostatic chuck defining a plurality of stepped surfaces, each of the plurality of stepped surfaces comprises a different horizontal depth;
a focus ring having a top surface and a bottom surface, the focus ring configured to surround a periphery of the workpiece when the workpiece is positioned on the electrostatic chuck;
an inner insulator ring configured to surround a portion of a periphery of the electrostatic chuck;
an outer insulator ring configured to surround a periphery of the inner insulator ring, the electrostatic chuck, and a conductive member, the focus ring being on the outer insulator ring such that the bottom surface of the focus ring is on a top surface of the outer insulator ring; and
the conductive member positioned vertically between at least a portion of the bottom surface of the focus ring, a top surface of the inner insulator ring, and positioned horizontally between a portion of the inner insulator ring and the outer insulator ring, the conductive member is spaced apart from the periphery of the electrostatic chuck along a first axis by a first distance and the conductive member is spaced apart from the periphery of the electrostatic chuck along a second axis by a second distance, the first axis intersecting with the second axis in a plane, and the first axis and the second axis forming an angle that differs from 90 degrees by less than 15 degrees.

12. The plasma processing apparatus of claim 11, wherein the conductive member comprises a conductive ring.

* * * * *